United States Patent [19]

Yamazaki et al.

[11] Patent Number: 4,704,624
[45] Date of Patent: Nov. 3, 1987

[54] SEMICONDUCTOR PHOTOELECTRIC CONVERSION DEVICE WITH PARTLY CRYSTALLIZED INTRINSIC LAYER

[75] Inventors: Shunpei Yamazaki; Susumu Nagayama, both of Tokyo, Japan

[73] Assignee: Semiconductor Energy Laboratory Co., Ltd., Japan

[21] Appl. No.: 725,742

[22] Filed: Apr. 22, 1985

[30] Foreign Application Priority Data

Apr. 20, 1984 [JP] Japan .................. 59-079662

[51] Int. Cl.[4] .......................................... H01L 27/14
[52] U.S. Cl. ........................................ 357/30; 357/58; 357/2; 357/59
[58] Field of Search .............. 357/30, 58, 59 D, 59 E, 357/59 B, 2, 30 K, 30 L, 30 D

[56] References Cited

U.S. PATENT DOCUMENTS

| | | | |
|---|---|---|---|
| 3,978,333 | 8/1976 | Crisman et al. | 357/59 D |
| 4,539,431 | 9/1985 | Moddel et al. | 357/30 J X |
| 4,591,892 | 5/1986 | Yamazaki | 357/30 |
| 4,591,893 | 5/1986 | Yamazaki | 357/30 |
| 4,620,058 | 10/1986 | Winterling et al. | 357/30 X |

FOREIGN PATENT DOCUMENTS

59-194478  11/1984  Japan .................. 357/30 K

OTHER PUBLICATIONS

Gutfeld, "Crystallization of silicon for Solar Cell Applications," *IBM Technical Disclosure Bulletin*, vol. 19, No. 10, Mar., 1977, pp. 3955–3956.

Chu et al., "Thin Film Polycrystalline Solar Cells," *Thirteenth IEEE Photovoltaic Specialists Conference-1978*, Washington, D.C., (Jun. 5–8, 1978), pp. 1106–1110.

*Primary Examiner*—Andrew J. James
*Assistant Examiner*—William A. Mintel
*Attorney, Agent, or Firm*—Gerald J. Ferguson, Jr.; Michael P. Hoffman; Michael J. Foycik, Jr.

[57] ABSTRACT

A semiconductor photoelectric conversion device comprises a first non-single crystal semiconductor layer of a first conductivity type. A second non-single crystal semiconductor layer of substantially an intrinsic conductivity type is formed on the first semiconductor layer; the second layer comprises a first crystallized region and a second crystallized region. The second crystallized region has a similar crystalline structure as that of the first semiconductor layer and extends from the first semiconductor layer toward the first crystallized region where the degree of crystallization of the first crystallized region is less than that of the second crystallized region. A third non-single crystal semiconductor layer of a second semiconductor type opposite to said first conductivity type is formed on the intrinsic layer.

2 Claims, 14 Drawing Figures

SEMICONDUCTOR PHOTOELECTRIC CONVERSION DEVICE WITH PARTLY CRYSTALLIZED INTRINSIC LAYER

BACKGROUND OF THE INVENTION

1. Field of the Invention

The present invention relates to a semiconductor photoelectric conversion device which has at least one PIN structure in which a first conductivity type (P- or N-type) non-single-crystal semiconductor layer, an intrinsic non-single-crystal semiconductor layer and a second conductivity type (reverse from the first conductivity type) non-single-crystal semiconductor layer are sequentially laminated in that order. Further, the present invention pertains to a method for the manufacture of such a semiconductor photoelectric cnversion device.

2. Description of the Prior Art

Heretofore a variety of semiconductor photoelectric conversion devices have been proposed which are of the type having at least one PIN structure mentioned above.

With these kinds of devices, light incident thereto creates carries, that is, electron-hole pairs in the intrinsic layer and the electrons and holes flow into one of the first and second conductivity type layers, that is, the N-type layer, and into the other, that is, the P-type layer, respectively, developing photo-voltage. Accordingly, in order to obtain a high photoelectric conversion efficiency, it is desired that the intrinsic layer of the PIN structure have no recombination centers with which the carriers combine. To this end, it is the general practice in the prior art to dope the intrinsic layer of the PIN structure with hydrogen or a halogen as a recombination center neutralizer.

Nevertheless, a relatively large number of recombination centers remain unextinguished in the vicinities of the boundaries between the intrinsic layer and the P-type layer and between the intrinsic layer and the N-type layer. These remaining recombination centers inflict losses on the electrons and holes flowing toward the N-type and P-type layers, respectively. Therefore, the prior art devices have the defect of low photoelectric conversion efficiency although the intrinsic layer of the PIN structure is doped with the recombination center neutralizer.

SUMMARY OF THE INVENTION

It is therefore an object of the present invention to provide a novel semiconductor photoelectric conversion device which achieves a high photoelectric conversion efficiency.

Another object of the present invention is to provide a novel manufacturing method which permits easy fabrication of a semiconductor photoelectric conversion device of high photoelectric conversion efficiency.

The semiconductor photoelectric conversion device of the present invention includes, as is conventional, at least one PIN structure in which a first conductivity type non-single-crystal semiconductor layer, an intrinsic non-single-crystal semiconductor layer and a second conductivity type (reverse from the first conductivity type) non-single-crystal semiconductor layer are sequentially laminated in that order. The intrinsic layer is doped with a recombination center neutralizer.

In accordance with an aspect of the present invention, however, the intrinsic layer of the PIN structure is crystallized in its regions near the boundaries between the intrinsic layer and the first and/or second conductivity type layer. The above crystallization means that when the intrinsic layer is formed of amorphous silicon, it is rendered into microcrystalline or polycrystalline semiconductor, or a mixture thereof, and that when the intrinsic layer is of microcrystalline or polycrystalline semiconductor, it is rendered into microcrystalline semiconductor of a larger grain size, or polycrystalline semiconductor.

When the device of the present invention is irradiated by light, carriers are generated in the intrinsic layer of the PIN structure. The carriers, i.e. electrons and holes flow into the N-type and P-type layers, respectively, yielding photovoltaic power.

In this case, since the intrinsic layer has its regions crystallized near the boundaries between it and the N-type and/or P-type layer, the number of recombination centers is far smaller than in the case where such regions are not crystallized. On account of this, the carriers, that is, the electrons and/or holes created in the intrinsic layer reach the first and/or P-type layers with a high efficiency, respectively.

Further, although the intrinsic layer has the above-said regions crystallized, since the other region is not crystallized and is higher in light absorptivity than the crystallized regions, the carrier generating ratio in the intrinsic layer is reduced only very slightly.

In accordance with another aspect of the present invention, the intrinsic layer of the PIN structure is crystallized throughout it. In this case, the crystallized semiconductor is grown in many columnar forms extending between the first and second conductivity type semiconductor layers. With such a device of the present invention, since the intrinsic layer is crystallized throughout, the photocarrier generating ratio is lower than in the case where the intrinsic layer is not crystallized, but this can easily be compensated by increasing the thickness of the intrinsic layer. Further, the carriers or electrons and holes reach the N-type and P-type layer efficiently, respectively. This is marked especially when the crystallized semiconductor is grown in a plurality of different columnar forms.

In accordance with another aspect of the present invention, the intrinsic layer is crystallized at least in its regions near the boundaries between it and the N-type and/or P-type layer, and the N-type and/or P-type layer is crystallized.

With such a device of the present invention, since the boundaries between the intrinsic layer and the N-type and/or P-type layer are formed by the crystallized region of the intrinsic layer and the crystallized N-type and/or P-type layer, the boundaries are crystallographically fit, ensuring that the electrons and holes developed in the intrinsic layer efficiently reach the N-type and P-type layers respectively. Further, since the N-type and/or P-type layer is crystallized, the N-type and/or P-type layer absorbs less light incident to the intrinsic layer than in the case where the N-type and/or P-type layer is not crystallized.

Thus, the semiconductor photoelectric conversion device of the present invention achieves a higher photoelectric conversion efficiency than does the conventional devices.

The semiconductor photoelectric conversion device manufacturing method of the present invention includes, as is conventional, a step of forming, on a substrate having a conductive surface, at least one PIN structure in which a first conductivity type non-single-crystal semiconductor layer, an intrinsic non-single-crystal semiconductor layer doped with a recombination center neutralizer and a second conductivity type non-single-crystal semiconductor layer sequentially laminated in that order, and a step of forming a electrode on the PIN structure.

In accordance with an aspect of the manufacturing method of the present invention however, a transparent substrate is used as the abovesaid substrate, and before or after the electrode forming step, the PIN structure is exposed to irradiation by light for annealing, through the transparent substrate, by which is crystallized a region of the intrinsic layer in the vicinity of the boundary between it and the first conductivity type layer or/and the entire region of the latter, or the entire region of the intrinsic layer or/and the first conductivity type layer. In this case, the electrode is formed by a transparent conductive layer of a metal oxide, or a reflective conductive layer of metal. The electrode can be formed as a two-layer structure which has a reflective conductive layer laminated on a transparent conductive layer.

In accordance with another aspect of the manufacturing method of the present invention, prior to the formation of the electrode, the PIN structure is irradiated by light for annealing from the opposite side from the substrate, by which is crystallized the region of the intrinsic layer near the boundary between it and the second conductivity type layer or/and the entire region of the latter, or the entire region of the intrinsic layer or/and the second conductivity type layer.

In accordance with another aspect of the manufacturing method of the present invention, the electrode is formed as a transparent layer, after the formation of the transparent electrode, the PIN structure is irradiated by light for annealing through the transparent electrode, by which is crystallized the region of the intrinsic layer near the boundary between it and the second conductivity type layer or/and the entire region of the latter, or the entire region of the intrinsic layer or/and the second conductivity type layer. In this case, a reflective conductive layer can be laminated on the transparent electrode after the formation of the latter.

In accordance with another aspect of the manufacturing method of the present invention, a transparent substrate is used, and before the electrode forming step, the PIN structure is irradiated by light for first annealing through the transparent substrate, and at the same time as or before or after it, the PIN structure is irradiated, from the side opposite from the transparent substrate, by second annealing light of a wavelength equal to or different from the first annealing light, thereby crystallizing the region of the intrinsic layer near the boundary between it and the first conductivity type layer or/and the entire region of the latter, the region of the intrinsic layer near the boundary between it and the second conductivity type layer or/and the entire region of the latter.

In accordance with yet another aspect of the manufacturing method of the present invention, a transparent substrate is used, and a transparent electrode is used. After the transparent electrode layer forming step, the PIN structure is irradiated by first annealing light through the transparent substrate, and at the same time as or before or after it, the PIN structure is irradiated, from the side opposite from the transparent substrate, by second annealing light of a wavelength equal to or different from the first annealing light, crystallizing the region of the intrinsic layer near the boundary between it and the first conductivity type layer or/and the entire region of the latter, the region of the intrinsic layer near the boundary between it and the second conductivity type layer or/and the entire region of the latter.

The manufacturing method of the present invention permits easy fabrication of the semiconductor photoelectric conversion device of the present invention which has the abovesaid excellent features.

Other objects features and advantages of the present invention will become more fully apparent from the following detailed description taken in conjunction with the accompanying drawings.

DESCRIPTION OF THE PREFERRED EMBODIMENTS

FIGS. 1 to 5 illustrates first, second, third, fourth nd fifth embodiments of the photoelectric conversion device of the present invention, in which a transparent electrode 2 of a conductive oxide such as tin oxide is deposited, for example, by means of an evaporation method, on a transparent substrate 1 made of a transparent insulating material such as glass.

The transparent electrode 2 has formed thereon a PIN structure 3.

The PIN structure 3 comprises P-type, intrinsic and N-type non-single-crystal semiconductor layers 3P, 3I and 3N which are laminated in that order, for instance.

The P-type layer 3P is formed of, for example, Si, $Si_xC_{1-x}(0<x<1)$, $Si_3N_{4-x}(0<x<b)$, $SiO_{2-x}(0<x<2)$ and has a thickness of, for instance, 100 to 200 Å. The intrinsic 3I is formed of, for instance, Si, Ge, $Si_xGe_{1-x}$ $(0<x<1)$ and has a thickness of, for example 0.4, to 1.0 μm. The N-type layer 3N is formed of, for example, silicon and has a thickness of, for instance, 200 to 500 Å.

The P-type layer 3P is formed in a reaction chamber by means of such a known CVD method as a low temperature CVD, photo CVD, plazma CVD or like method, using a semiconductor material gas(es) and a P-type impurity material gas as diborane ($B_2H_6$). The intrinsic layer 3I is formed in the same reaction chamber as that for the P-type layer 3P or in a separate chamber by means of the abovesaid CVD method using semiconductor material gas and, if necessary, hydrogen as the recombination center neutralizer. The N-type layer 3N is formed in the same reaction chamber as the that for the P-type and/or intrinsic layer or in separate chamber by means of the above said CVD method using a semiconductor material gas and, an N-type impurity material gas, as phosphine (PH$_3$).

The PIN structure 3 has formed thereon a reflective electrode 4. The reflective electrode 4 comprises a transparent conductive layer 4T of a conductive oxide such as indium oxide and a reflective conductive layer 4R as of aluminum which are laminated in that order. The transparent conductive layer 4T and the reflective conductive layer 4R can be deposited by the evaporation technique.

Since the above structure is apparently similar to the conventional device, no further detailed description will be given.

Figure 1:
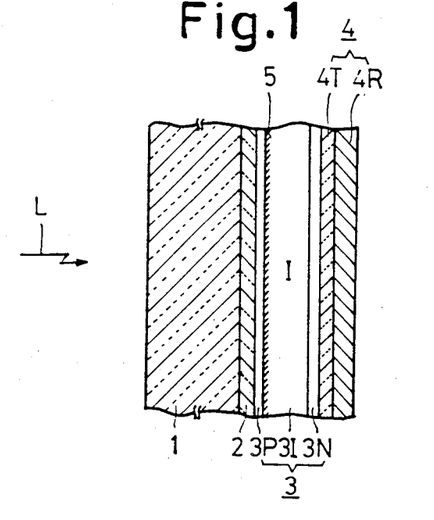
FIGS. 1, 2, 3, 4 and 5 are sectional views schematically illustrating first, second, third, fourth and fifth embodiments of the semiconductor photoelectric conversion device of the present invention, respectively.

In the first embodiment of the present invention, shown in the FIG. 1 however, the region of the intrinsic layer 3I of the abovesaid PIN structure 3 in the vicinity of the boundary between it and the P-type layer 3P is crystallized as indicated by 5. The crystallized region 5 can be formed by irradiating the PIN structure 3 with annealing light through the transparent substrate 1 and transparent electrode 2. By using light having such a relatively short wavelength as 500 nm as less, only the region 5 can be crystallized without crystallizing the P-type layer 3P.

Figure 2:
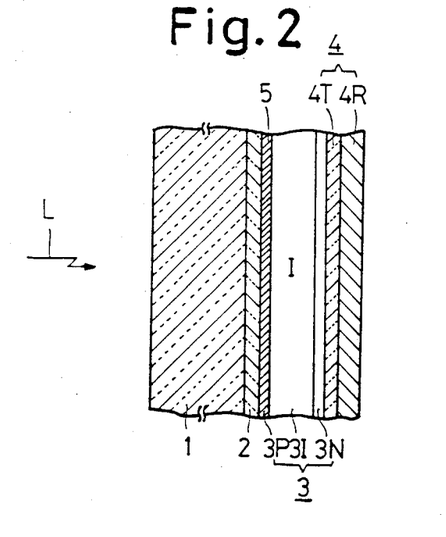

In a second embodiment shown in FIG. 2, substantially the P-type layer 3P alone is crystallized throughout it. The crystallized p-type layer can be formed by irradiation the PIN structure 3 with annealing light through the transparent substrate 1 and electrode 2 as described in conjunction with the embodiment shown in FIG. 1.

Figure 3:
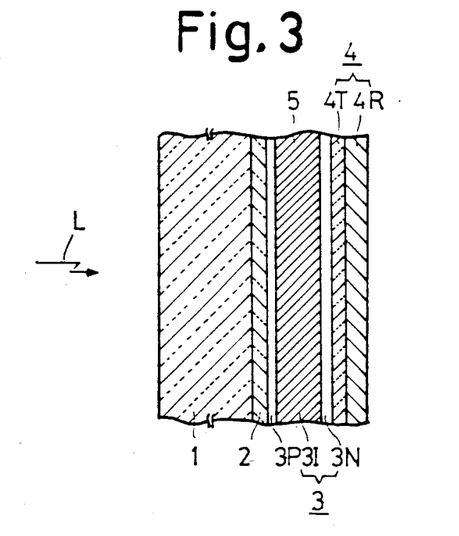

In the third embodiment depicted in FIG. 3, substantially only he intrinsic layer 3I is crystallized throughout. The crystallized intrinsic layer 3I can be formed by irradiation the PIN structure 3 with annealing light through the transparent substrate 1 and electrode 2 a described above. In this case, however, the light has longer wavelength as 500 nm to 2 μm.

Figure 4:
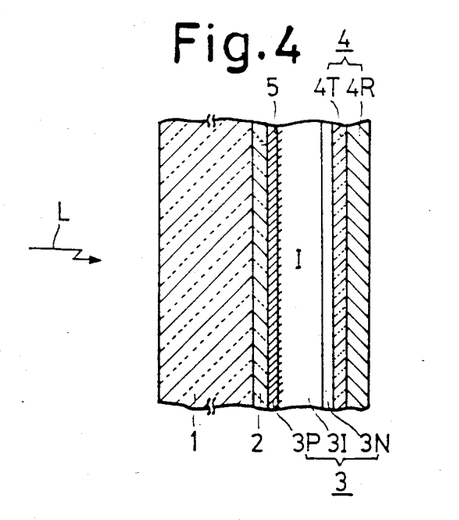

FIG. 4 illustrates a fourth embodiment of the present invention which is a combination of the first and second embodiment shown in FIGS. 1 and 2, respectively. Therefor, no further description will be given.

Figure 5:
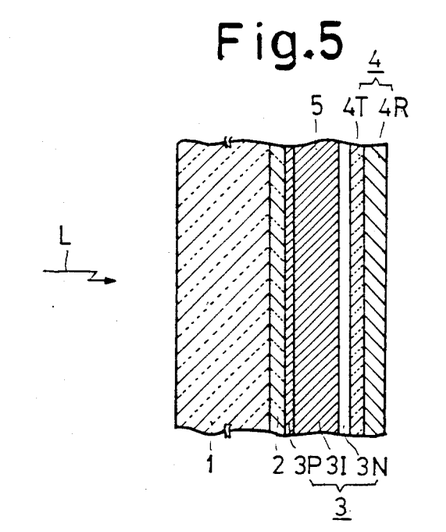

FIG. 5 illustrates a fifth embodiment of the present invention which is a combination of the second and third embodiments shown in FIGS. 2 and 3, respectively.

Figure 6:
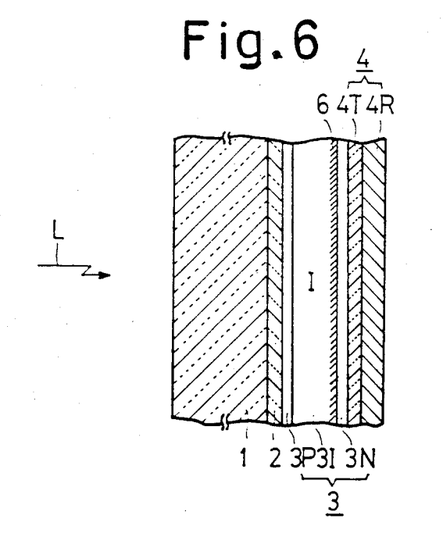
FIGS. 6, 7 and 8 are sectional views schematically illustrating sixth, seventh and eighth embodiments of the semiconductor photoelectric conversion device of the present invention, respectively.
Figure 7:
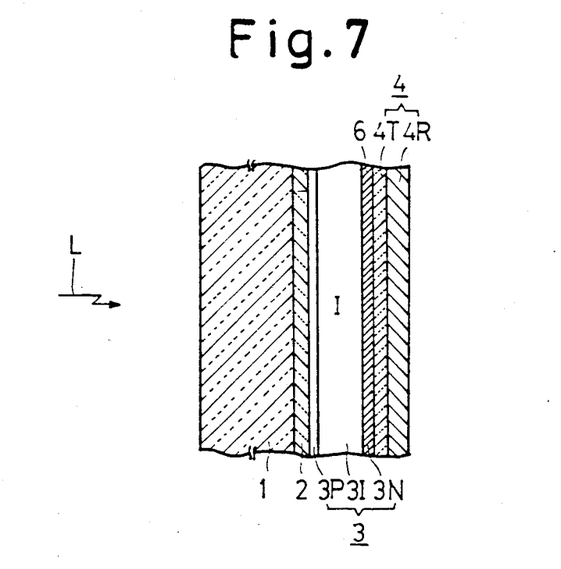
Figure 8:
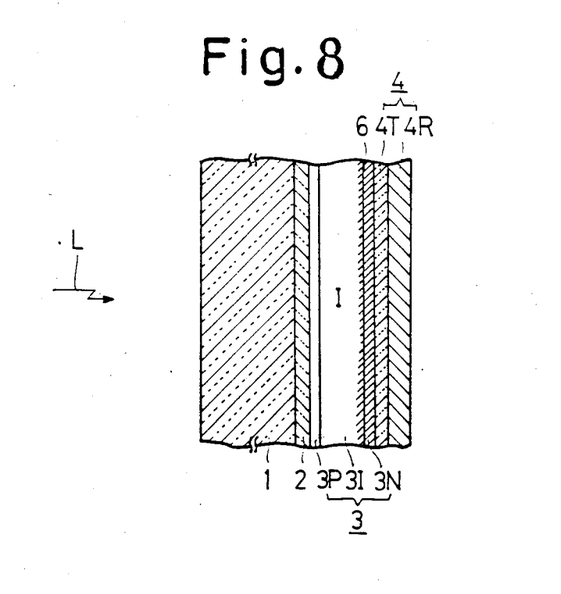

FIGS. 6, 7 and 8 illustrate sixth, seventh and eighth embodiments of the present invention. In FIGS. 6 to 8, tothe corresponding ports of FIGS. 1 to 5 same numerals are indicted, therefor, no further detail description will be given.

In FIG. 1, a region of the intrinsic layer 3I in the vicinity of the boundary between it and the N-type layer 3N is crystallized as indicated by 6.

The crystallized region 6 can be formed by irradiating the PIN structure 3 with annealing light having relatively sort wave length from the side opposite from the substrate 1 before the formation of the reflective electrode 4. This exposure to the irradiation by light can also be effected through the transparent conductive laer 4T prior to the formation of and the reflective conductive layer 4R of the reflective electrode 4.

FIG. 7 illustrates another embodiment in which substantially only the N-type layer is crystallized by exposing to the irradiation by light as described in FIG. 6.

FIG. 8 illustrates another embodiment which is a combination of the sixth and seventh embodiments shown in FIGS. 6 and 7, respectively.

Figure 9:
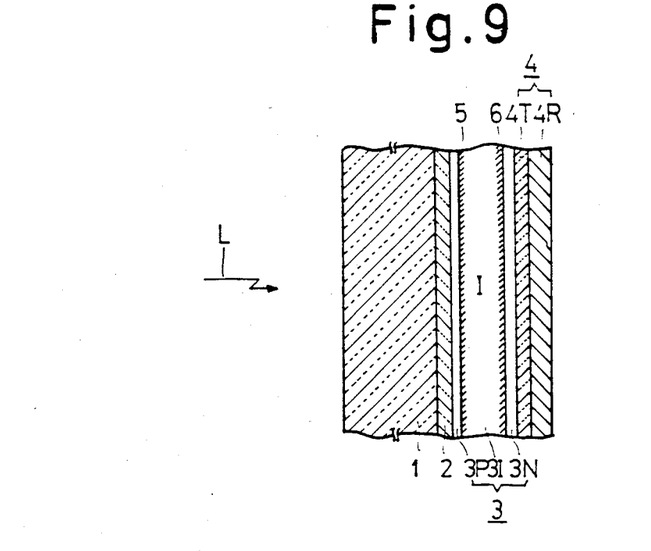
FIGS. 9, 10, 11 and 12 are sectional views schematically illustrates ninth, tenth, eleventh and twelfth embodiment of the semiconductor photoelectric conversion device of the present invention, respectively.

FIG. 9 illustrates another embodiment which is a combination of the first and sixth embodiments shown in FIGS. 1 and 6. respectively.

Figure 10:
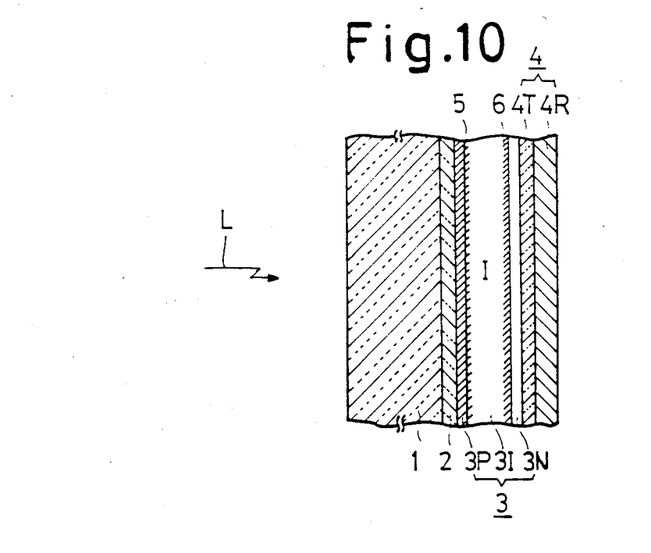

FIG. 10 illustrates another embodiment which is a combination of the fourth and sixth embodiments shown in FIGS. 4 and 6, respectively.

Figure 11:
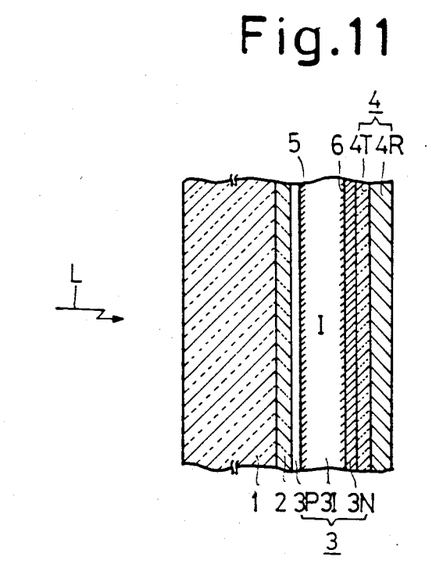

FIG. 11 illustrates another embodiment which is a combination of the first and eighth embodiments shown in FIGS. 1 and 8, respectively.

Figure 12:
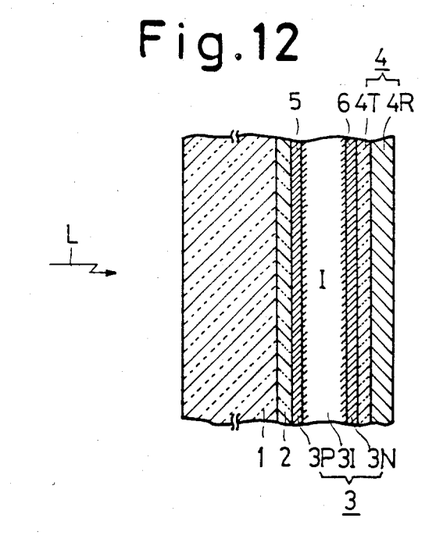

FIG. 12 illustrates another embodiment which is a combination of the fourth and eighth embodiments shown in FIGS. 4 and 8, respectively.

The above is the construction of the first species embodiments of the semiconductor photoelectric conversion device of the present invention.

With the each device of such a construction as described above, incident light L to the transparent substrate 1 passes through it and the transparent electrode 2 and enters into the intrinsic layer 3I through the thin P-type layer 3P of the PIN structure 3. The light having thus entered into the intrinsic layer 3I creates therein carriers, i.e. electron-hole pairs. The incident light L is mostly absorbed by the intrinsic layer 3I, but unabsorbed light passes through the N-type layer 3N and enters into the reflective electrode 4, where is is reflected back to the intrinsic layer 3I through the N-type layer 3N. By the re-entered light, carriers are developed in the intrinsic layer 3I. Of the carriers or electron-holes pairs thus created in the intrinsic layer 3I, electrons flow through the N-type layer 3N to reach the reflective electrode 4, whereas holes flow through the P-type layer 3P to reach the transparent electrode 2. By the abovesaid mechanism, photo-voltaic power is generated across the electrodes 2 and 4.

Figure 13:
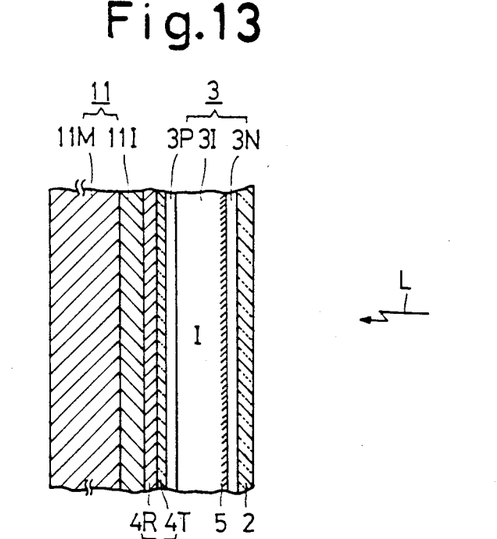
FIGS. 13 and 14 are sectional views schematically illustrates twelfth and thirteenth ebodiment of the semiconductor photoelectric conversion device and method of making the same of the present invention, respectively.
Figure 14:
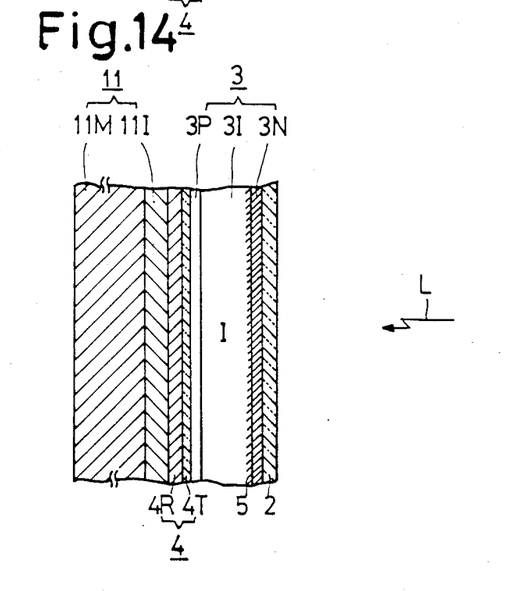

FIGS. 13 and 14 illustrate thirteenth and fourteenth embodiments of the semiconductor photoelectric conversion device of the present invention, in which like parts corresponding to those in FIG. 1 are identified by the same reference numerals and no detailed description will be repeated.

In these embodiments, the same reflective electrode 4, the same PIN structure 3 and the same transparent electrode 2 as those described in connection with FIG. 1 are sequentially laminated in that order on a substrate 11 having structure member 11M as of stainless steel and an insulating film 11I as of heat resistant resin deposited on substrate member 11M. In this case, the reflective electrode 4 has the construction that the same reflective conductive layer 4R and transparent conductive layer 41 as those described previously with respect to FIG. 1 are laminated in that order on the insulating film 11I. The PIN structure 3 had the construction that the same N-type, I-type and P-type layers 3N, 3I and 3P as those described previously in respect to FIG. 1 are laminated in that order on the reflective electrode 4.

According to abovesaid embodiments, by incident light L to the device on the side of the transparent electrode 2, photo-voltaic power can be generated across the transparent electrode 2 and the reflective electrode 4 through the same mechanism as described previously in conjunction with FIGS. 1 to 12.

The semiconductor photoelectric conversion device of the present invention described above has the abovesaid crystallized region in the PIN structure 3, and hence produces the excellent effects referred to previously.

Further, the manufacturing method of the present invention permits easy fabrication of such a semiconductor photoelectric conversion device as mentioned above.

The foregoing embodiments should be construed as being merely illustrative of the present invention and should not be construed as limiting the invention specifically thereto.

It will be apparent that many modifications and variations may be effected without departing from the scope of the novel concepts of the present invention.

What is claimed is:

1. A semiconductor photoelectric conversion device comprising:
    a first non-single crystal semiconductor layer of a first conductivity type;
    a second non-single crystal semiconductor layer of substantially an intrinsic conductivity type formed on said first semiconductor layer, said second layer comprising a first crystallized region and a second crystallized region, said second crystallized region having a similar crystalline structure as that of said first semiconductor layer and extending from said first semiconductor layer toward the first crystallized region where the degree of crystallization of said first crystallized region is less than that of said second crystallized region;
    a third non-single crystal semiconductor layer of a second semiconductor type opposite to said first conductivity type formed on said intrinsic semiconductor layer; and
    a pair of electrodes formed on outer surfaces of said first and third semiconductor layers.

2. A semiconductor photoelectric conversion device according to claim 1 wherein the crystallized semiconductor in the second crystallized region is grown in a plurality of different columnar forms.

* * * * *